United States Patent
Nabetani et al.

(10) Patent No.: US 6,791,328 B1
(45) Date of Patent: Sep. 14, 2004

(54) METHOD AND APPARATUS FOR VERY HIGH FIELD MAGNETIC RESONANCE IMAGING SYSTEMS

(75) Inventors: Akira Nabetani, Tokyo (JP); Ronald Dean Watkins, Niskayuna, NY (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 10/456,816

(22) Filed: Jun. 6, 2003

(51) Int. Cl.$^7$ .................................................. G01V 3/00
(52) U.S. Cl. ...................................... 324/318; 324/322
(58) Field of Search ............................... 324/318, 322, 324/312, 314, 306, 307, 309, 300; 600/421, 422

(56) References Cited

U.S. PATENT DOCUMENTS

| | | | |
|---|---|---|---|
| 4,620,155 A | 10/1986 | Edelstein | |
| 4,680,548 A | 7/1987 | Edelstein et al. | |
| 4,820,987 A | 4/1989 | Mens | |
| 4,833,409 A | 5/1989 | Eash | |
| 4,887,039 A | 12/1989 | Roemer et al. | |
| 4,890,063 A | 12/1989 | Haragashira | |
| 5,144,244 A | 9/1992 | Kess | |
| 5,243,287 A | 9/1993 | Hashoian et al. | |
| 5,777,474 A | 7/1998 | Srinivasan | |
| 5,998,999 A | * 12/1999 | Richard et al. | 324/318 |
| 5,999,000 A | 12/1999 | Srinivasan | |
| 6,236,206 B1 | 5/2001 | Hartman et al. | |
| 6,501,274 B1 | * 12/2002 | Ledden | 324/318 |
| 6,522,143 B1 | * 2/2003 | Fujita et al. | 324/318 |
| 6,538,441 B1 | 3/2003 | Watkins et al. | |
| 6,552,544 B2 | 4/2003 | Wong et al. | |

* cited by examiner

*Primary Examiner*—Louis Arana
(74) *Attorney, Agent, or Firm*—Armstrong Teasdale LLP

(57) ABSTRACT

A radio frequency (RF) coil assembly for imaging a subject volume using a very high field Magnetic Resonance Imaging (MRI) system operable at substantially high frequencies includes a plurality of conductors arranged cylindrically and disposed about a patient bore of the MRI system, a plurality of capacitive elements disposed between and connecting respective ends of the conductors, the plurality of conductors and plurality of capacitive elements forming a high band pass birdcage configuration, and a plurality of dynamic disabling switches, each dynamic disabling switch electrically coupled in parallel with a respective capacitive element to form a parallel resonant circuit.

29 Claims, 16 Drawing Sheets

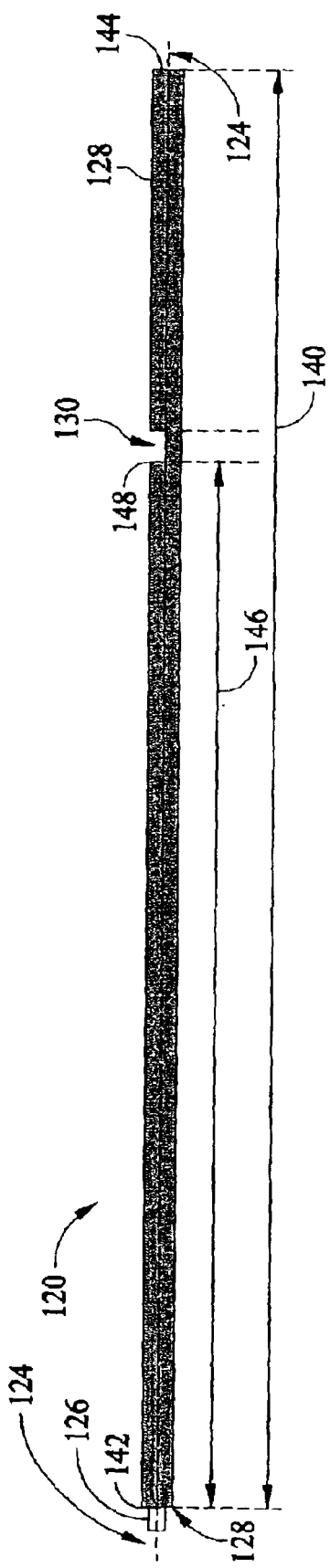
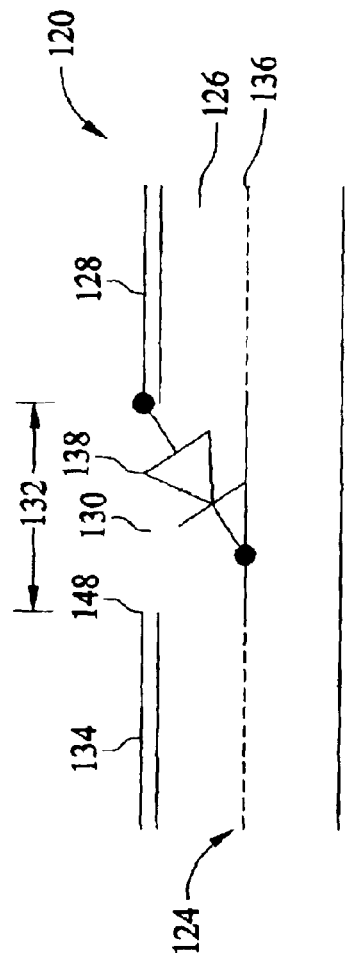
FIG. 3
FIG. 4 wavelength electric characteristics of coaxial cable with open end electric characteristics of coaxial cable with short end Dynamic disabling switch attachment methods in case of 16 high-pass birdcage coil.

Dynamic disabling switch implementation methods into birdcage coil.

• Show soldering place

Dynamic disabling switch implementation methods into TEM resonator.

METHOD AND APPARATUS FOR VERY HIGH FIELD MAGNETIC RESONANCE IMAGING SYSTEMS

BACKGROUND OF THE INVENTION

This invention relates to a Magnetic Resonance Imaging (MRI) system. More particularly, this invention relates to radio frequency (RF) coils used in MRI systems for transmitting and/or receiving RF signals.

MRI scanners, which are used in various fields such as medical diagnostics, typically use a computer to create images based on the operation of a magnet, a gradient coil assembly, and at least one radiofrequency coil. The magnet creates a uniform main magnetic field that makes nuclei, such as hydrogen atomic nuclei, responsive to radiofrequency excitation. The gradient coil assembly imposes a series of pulsed, spatial magnetic fields upon the main magnetic field to give each point in the imaging volume a spatial identity corresponding to its unique set of magnetic fields during the imaging pulse sequence. The radiofrequency coil(s) creates an excitation frequency pulse that temporarily creates an oscillating transverse magnetization that is detected by the radiofrequency coil and used by the computer to create the image.

Generally, very high field strength is characterized as greater than 2 Tesla (2T). Higher magnetic field strength imposes challenges on the RF coil, such as balancing inductance and capacitance at relatively higher frequencies, i.e. greater than 64 MegaHertz (MHz). At very high magnetic fields, and therefore very high Larmor frequencies, standard birdcage coils with moderately narrow rung copper strips have relatively high inductance requiring very low capacitor values in order to resonate the coil. This is problematic for a number of reasons. First, high currents through small value capacitors will have very high voltage potential across them which can result in a local stray electric field that dissipates RF power in the form of heat in an imaging subject.

There are two types of electric fields associated with MRI. The first is due to time-varying B1 magnetic field present within the imaging subject and the second type is due to electric charges on the capacitors in the RF coil structure. When a NMR system is operating at a relatively high frequency range, for example above 100 MHz, significant radiation loss may occur. The increased radiation loss in high frequency ranges results in an increase in RF power used to generate the excitation and a resultant decrease in the signal-to-noise (SNR) of the signals received.

BRIEF DESCRIPTION OF THE INVENTION

In one aspect, a radio frequency (RF) coil assembly for imaging a subject volume using a very high field Magnetic Resonance Imaging (MRI) system operable at substantially high frequencies is provided. The MRI system includes a plurality of conductors arranged cylindrically and disposed about a patient bore of the MRI system, a plurality of capacitive elements disposed between and connecting respective ends of the conductors, the plurality of conductors and plurality of capacitive elements forming a high band pass birdcage configuration, and a plurality of dynamic disabling switches, each dynamic disabling switch electrically coupled in parallel with a respective capacitive element to form a parallel resonant circuit.

In another aspect, a magnetic resonance imaging (MRI) system is provided. The MRI system includes a radio frequency (RF) coil assembly for imaging a subject volume using substantially high frequencies. The RF coil includes a plurality of conductors arranged cylindrically and disposed about a patient bore of the MRI system, a plurality of capacitive elements disposed between and connecting respective ends of the conductors, the plurality of conductors and plurality of capacitive elements forming a high band pass birdcage configuration, and a plurality of dynamic disabling switches, each dynamic disabling switch electrically coupled in parallel with a respective capacitive element to form a parallel resonant circuit.

In a further aspect, a TEM resonator is provided. The TEM resonator includes a plurality of conductors arranged cylindrically and disposed about a patient bore, a plurality of capacitive elements disposed between and connecting respective ends of the conductors, the plurality of conductors and plurality of capacitive elements forming TEM resonator configuration, and a plurality of dynamic disabling switches, each dynamic disabling switch electrically coupled in parallel with a respective capacitive element to form a parallel resonant circuit.

In still a further aspect, a method for operating a RF coil in a very high field Magnetic Resonance Imaging (MRI) system operable at substantially high frequencies is provided. The method includes arranging a plurality of conductors cylindrically around a patient bore of the MRI system, connecting a plurality of capacitive elements between respective ends of the conductors, the plurality of conductors and the plurality of capacitive elements forming a high band pass birdcage configuration, connecting a plurality of dynamic disabling switches in parallel with a respective capacitive element to form a parallel resonant circuit, each dynamic disabling switch including a diode, and connecting a switching bias to a second end of said dynamic disabling switch, the switching bias configured to forward bias and reverse bias said diode.

BRIEF DESCRIPTION OF THE DRAWINGS

FIG. 3 is a first exemplary dynamic disabling switch that can be used with the RF coil shown in FIG. 2.

FIG. 4 is portion of the dynamic disabling switch shown in FIG. 3.

DETAILED DESCRIPTION OF THE INVENTION

As used herein, an element or step recited in the singular and proceeded with the word "a" or "an" should be understood as not excluding plural said elements or steps, unless such exclusion is explicitly recited. Furthermore, references to "one embodiment" of the present invention are not intended to be interpreted as excluding the existence of additional embodiments that also incorporate the recited features.

Figure 1:
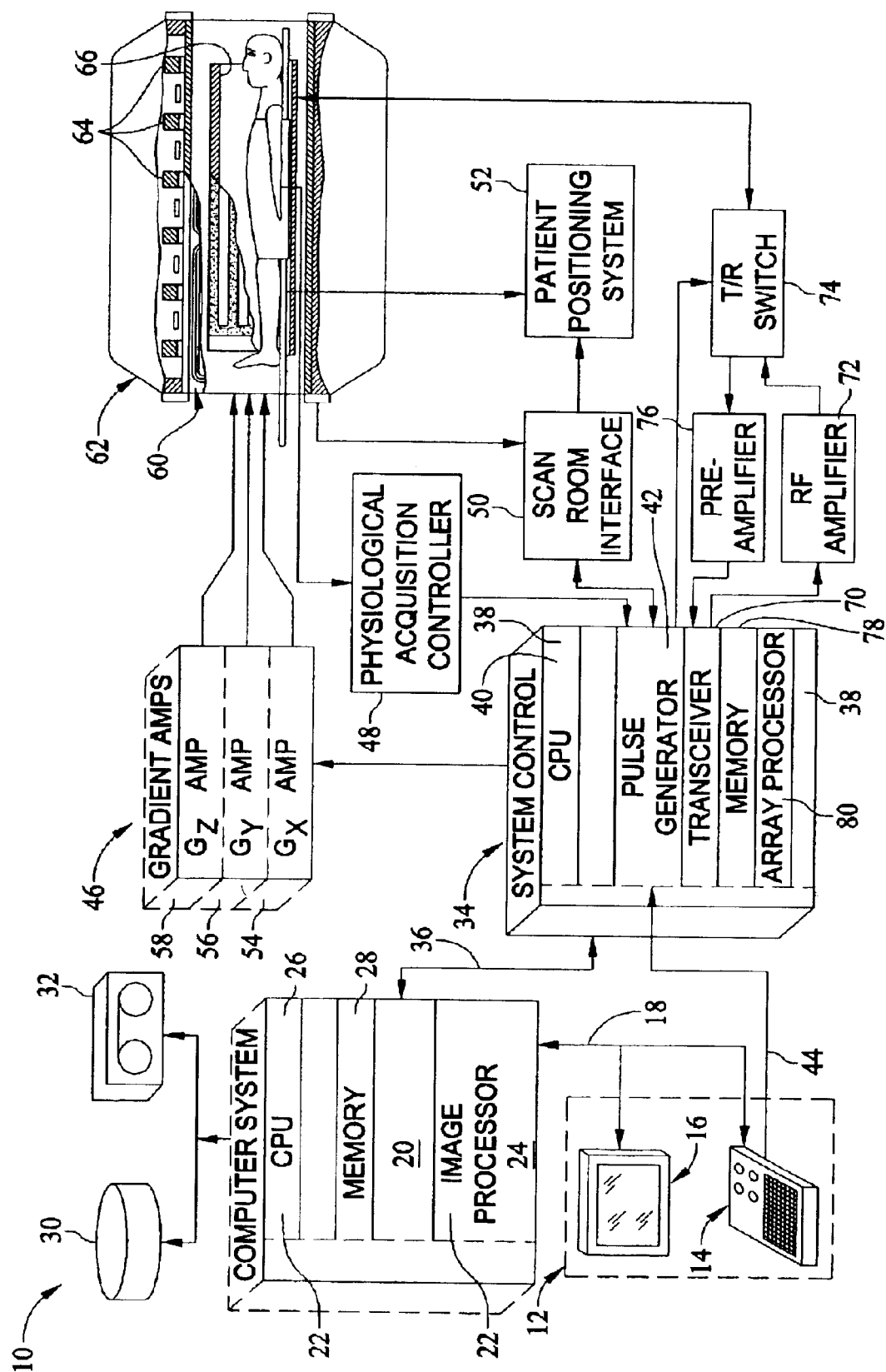
FIG. 1 is a block schematic diagram of a Magnetic Resonance Imaging (MRI) system.

FIG. 1 is a block diagram of an embodiment of a magnetic resonance imaging (MRI) system 10 in which the herein described systems and methods are implemented. MRI 10 includes an operator console 12 which includes a keyboard and control panel 14 and a display 16. Operator console 12 communicates through a link 18 with a separate computer system 20 thereby enabling an operator to control the production and display of images on screen 16. Computer system 20 includes a plurality of modules 22 which communicate with each other through a backplane. In the exemplary embodiment, modules 22 include an image processor module 24, a CPU module 26 and a memory module 28, also referred to herein as a frame buffer for storing image data arrays. Computer system 20 is linked to a disk storage 30 and a tape drive 32 to facilitate storing image data and programs. Computer system 20 is communicates with a separate system control 34 through a high speed serial link 36.

System control 34 includes a plurality of modules 38 electrically coupled using a backplane (not shown). In the exemplary embodiment, modules 38 include a CPU module 40 and a pulse generator module 42 that is electrically coupled to operator console 12 using a serial link 44. Link 44 facilitates transmitting and receiving commands between operator console 12 and system command 34 thereby allowing the operator to input a scan sequence that MRI system 10 is to perform. Pulse generator module 42 operates the system components to carry out the desired scan sequence, and generates data which indicative of the timing, strength and shape of the RF pulses which are to be produced, and the timing of and length of a data acquisition window. Pulse generator module 42 is electrically coupled to a gradient amplifier system 46 and provides gradient amplifier system 46 with a signal indicative of the timing and shape of the gradient pulses to be produced during the scan. Pulse generator module 42 is also configured to receive patient data from a physiological acquisition controller 48. In the exemplary embodiment, physiological acquisition controller 48 is configured to receive inputs from a plurality of sensors indicative of a patients physiological condition such as, but not limited to, ECG signals from electrodes attached to the patient. Pulse generator module 42 is electrically coupled to a scan room interface circuit 50 which is configured to receive signals from various sensors indicative of the patient condition and the magnet system. Scan room interface circuit 50 is also configured to transmit command signals such as, but not limited to, a command signal to move the patient to a desired position, to a patient positioning system 52.

The gradient waveforms produced by pulse generator module 42 are input to gradient amplifier system 46 that includes a $G_x$ amplifier 54, a $G_y$ amplifier 56, and a $G_z$ amplifier 58. Amplifiers 54, 56, and 58 each excite a corresponding gradient coil in gradient coil assembly 60 to generate a plurality of magnetic field gradients used for position encoding acquired signals. In the exemplary embodiment, gradient coil assembly 60 includes a magnet assembly 62 that includes a polarizing magnet 64 and a whole-body RF coil 66.

In use, a transceiver module 70 positioned in system control 34 generates a plurality of electrical pulses which are amplified by an RF amplifier 72 that is electrically coupled to RF coil 66 using a transmit/receive switch 74. The resulting signals radiated by the excited nuclei in the patient are sensed by RF coil 66 and transmitted to a preamplifier 76 through transmit/receive switch 74. The amplified NMR (nuclear magnetic resonance) signals are then demodulated, filtered, and digitized in a receiver section of transceiver 70. Transmit/receive switch 74 is controlled by a signal from pulse generator module 42 to electrically connect RF amplifier 72 to coil 66 during the transmit mode and to connect preamplifier 76 during the receive mode. Transmit/receive switch 74 also enables a separate RF coil (for example, a surface coil) to be used in either the transmit or receive mode.

The NMR signals received by RF coil 66 are digitized by transceiver module 70 and transferred to a memory module 78 in system control 34. When the scan is completed and an array of raw k-space data has been acquired in the memory module 78. The raw k-space data is rearranged into separate k-space data arrays for each cardiac phase image to be reconstructed, and each of these is input to an array processor 80 configured to Fourier transform the data into an array of image data. This image data is transmitted through serial link 36 to computer system 20 where it is stored in disk memory 30. In response to commands received from operator console 12, this image data may be archived on tape drive 32, or it may be further processed by image processor 24 and transmitted to operator console 12 and presented on display 16.

Figure 2:
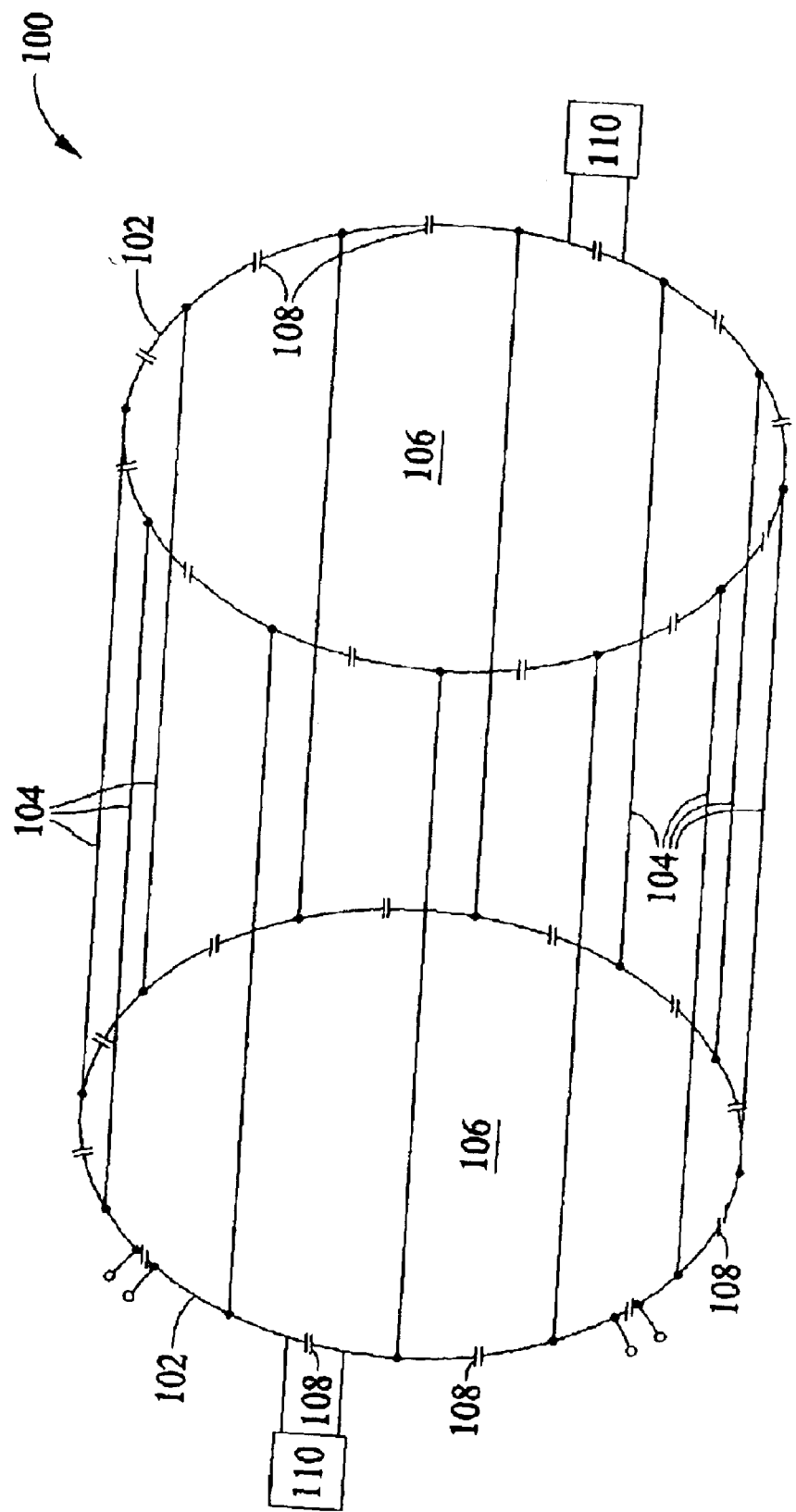
FIG. 2 is an exemplary radio frequency (RF) coil that can be used with the MRI system shown in FIG. 1.

FIG. 2 is schematic illustration of an exemplary RF coil 100 that can be used with MRI system 10 shown in FIG. 1. RF coil 100 includes two conductive end loops 102 and a plurality of conductors 104 electrically coupled to end loops 102 and arranged substantially cylindrically around a central axis or patient bore 106 to form a coil structure commonly referred to as a "birdcage". End loops 102 and conductors 104 define a substantially cylindrical imaging volume into which a subject to be examined is subjected to a RF field generated by RF coil 100. RF coil 100 also includes a plurality of capacitors 108 such as, but not limited to, low inductance end ring capacitors serially coupled to conductors 104 and configured to electrically interconnect connect connectors 104 at each respective end of conductor 104. MRI system 10 also includes at least one dynamic disabling switch 110 electrically to RF coil 100.

Figure 5A:
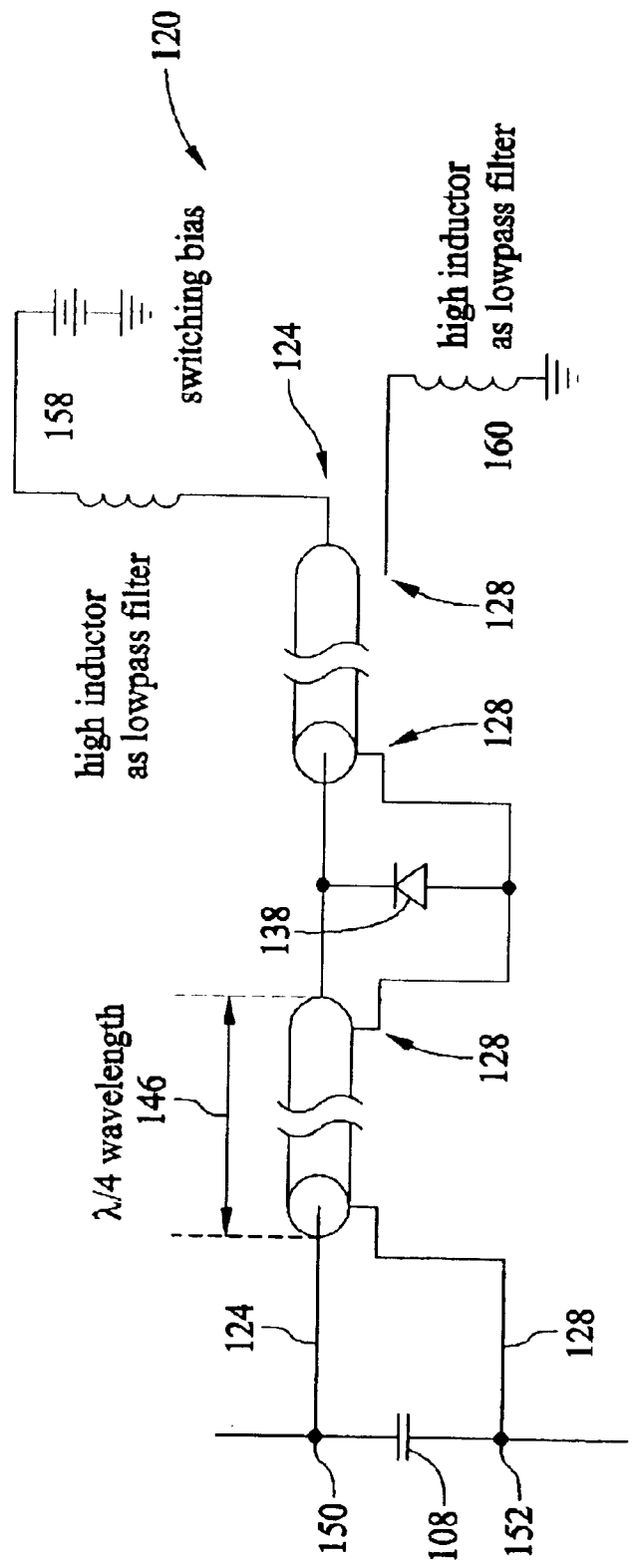
FIG. 5a is an exemplary simplified electrical schematic of the switch shown in FIG. 3.
Figure 10:
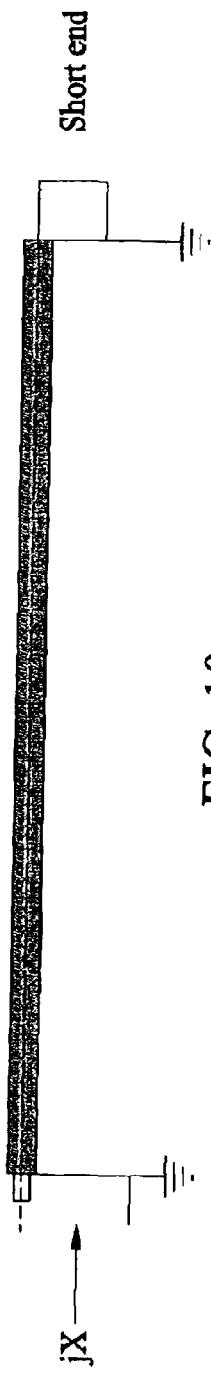
FIG. 10 is the dynamic disabling switch shown in FIG. 3 with a shorted end.

FIG. 3 is an exemplary dynamic disabling switch 120 that can be used with RF coil 100 (shown in FIG. 2) or RF coil 66 (shown in FIG. 10). FIG. 4 is a portion of switch 120 shown in FIG. 3. In one embodiment, switch 120 is fabricated using semi-rigid coaxial cable 122. In another embodiment, switch 120 is fabricated using lumped elements as shown in FIG. 5a. Coaxial cable 122 includes a center conductor 124 fabricated from a metallic material, a middle portion 126 surrounding center conductor 124, and an outer conductor 128, fabricated from a metallic material, surrounding middle portion 126. In another embodiment, switch 120 can be fabricated using lumped elements. In another embodiment, switch 120 is fabricated using lumped elements as shown in FIG. 5a. In the exemplary embodiment, middle portion 126 is an insulator fabricated from a material such as, bot not limited to, Polytetrafluoroethylene (PTFE), i.e. Teflon. In another exemplary embodiment, middle portion 126 is fabricated from any suitable material that includes low loss characteristics such that a signal loss is reduced in RF coil 100.

Switch 120 includes an opening 130, that includes a width 132, and extends from a outer conductor outer surface 134 to an inner conductor outer surface 136. More specifically, a portion of middle portion 126 is removed thus exposing inner conductor 124. A diode 138 is positioned in opening 130 and electrically coupled to inner conductor 124 and outer conductor 128. Switch 120 includes a first length 140 that extends from a first end 142 of switch 120 to a second end 144 of switch 120 and a second length 146 that extends from first end 142 to first opening end 148. Diode 138 is electrically coupled such that when diode 138 is forward biased, current flows from outer conductor 128 to inner conductor 124. Alternatively, when diode 138 is reverse biased, current does not flow between inner conductor 124 and outer conductor 128.

Figure 5B:
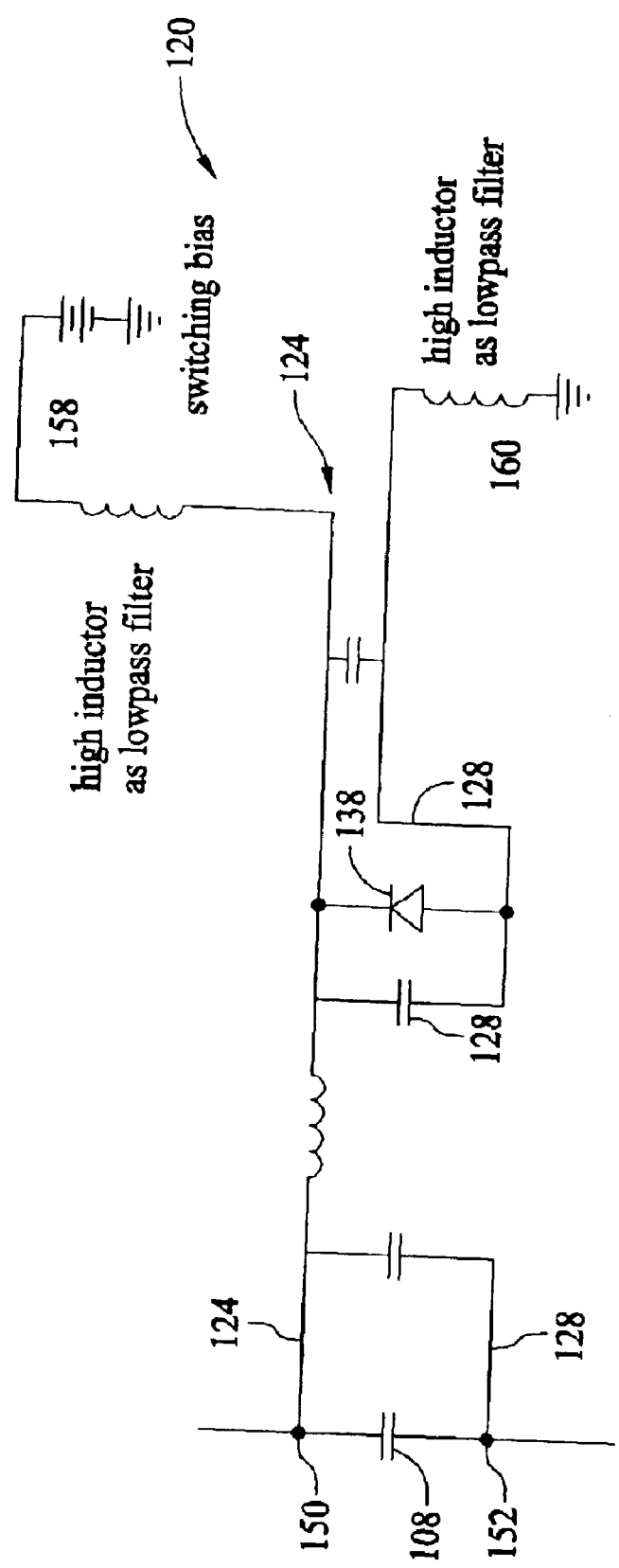
FIG. 5b is an exemplary simplified electrical schematic of the switch shown in FIG. 3.
Figures 6, 7:
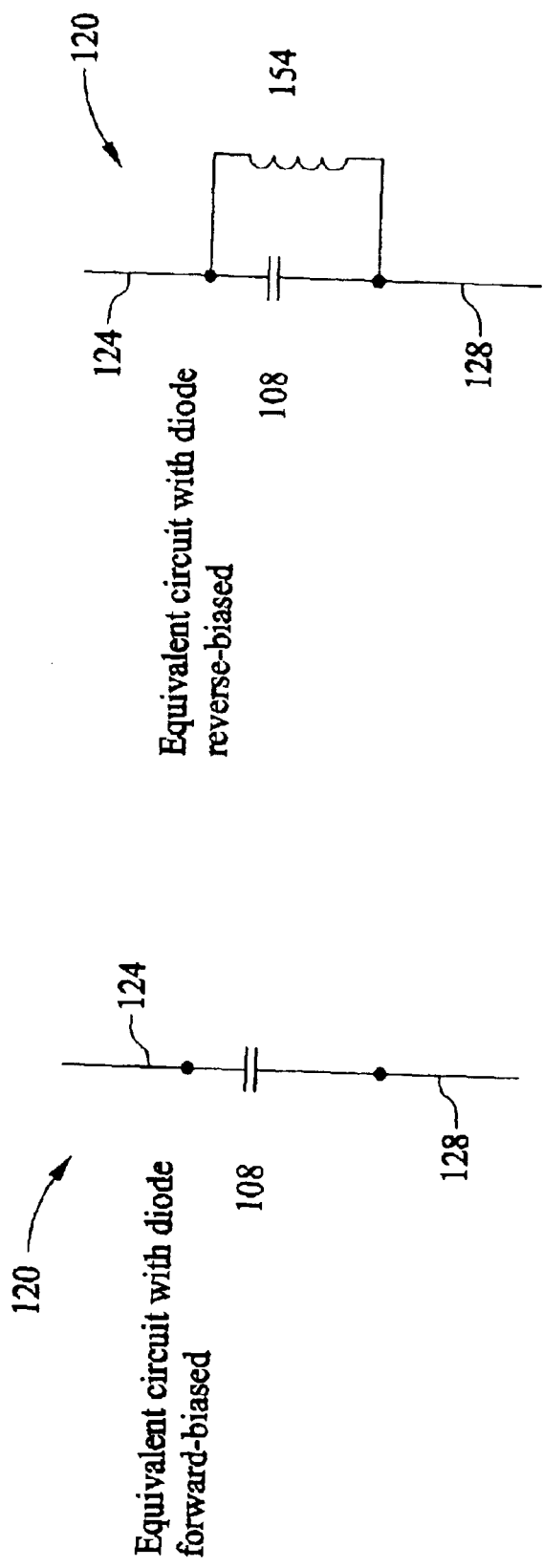
FIG. 6 is an operationally equivalent schematic of the switch shown in FIG. 3.
FIG. 7 is an operationally equivalent schematic of the switch shown in FIG. 3.

FIG. 5a is simplified electrical schematic of dynamic disabling switch 120 shown in FIG. 3. FIG. 5b is another simplified electrical schematic of dynamic disabling switch 120 shown in FIG. 3 using lumped circuit elements instead of the coaxial cable. FIG. 6 is schematic illustration of an operationally equivalent circuit depicting diode 138 in a forward biased state. FIG. 7 is schematic illustration of an operationally equivalent circuit depicting diode 138 in a reverse biased state.

In use, switch 120 is electrically coupled in parallel with at least one end ring capacitor 108 by connecting inner conductor 124 to a first side 150 of capacitor 108 and connecting outer conductor 128 to a second side 152 of capacitor 108. A portion of outer conductor is removed to form opening 130. Diode 138 is then electrically coupled between inner conductor 124 and outer conductor 128. As shown in FIG. 6, when diode 138 is forward biased, switch 120 and capacitor 108 are equivalent to capacitor 108. As shown in FIG. 7, when diode 138 is reverse biased, switch 120 can be modeled as an inductor 154 in parallel with capacitor 108. Accordingly, length 146 is selected such that length 146 is approximately equivalent to one-quarter wavelength ($\lambda/4$) of the working frequency of RF coil 100. Length 140 is selected by modeling switch 120 as inductor 154. The size of inductor 154 is selected such that when inductor 154, i.e. switch 120, is electrically coupled in parallel with capacitor 108, the combination of capacitor 108 and inductor 154 form a resonant circuit. More specifically, the circuit's natural frequency $\omega_0$ makes the imaginary part of the complex impedance equal to zero.

When $\omega_0$ is defined as an operational angular frequency of RF coil 100, then inductor 154 can be defined in accordance with:

$$\omega_0 = 2\pi f = \frac{1}{\sqrt{CL}}$$

where,

C is cpacitor 108, and

L is inductor 154.

For example, if f is set equal to 298 MHz, then length 140 can be selected between approximately one-quarter wavelength and approximately one-half wavelength of the operational angular frequency of RF coil 100.

Figure 8:
FIG. 8 is the dynamic disabling switch shown in FIG. 3 with an open end.
Figure 9:
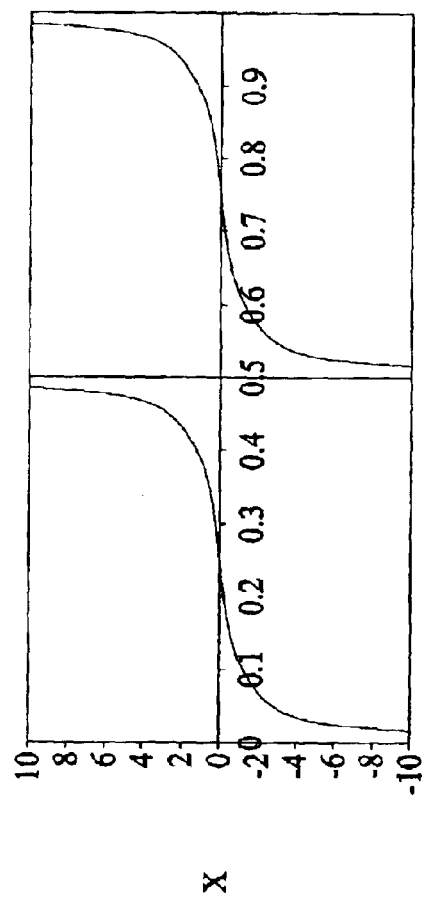
FIG. 9 is a graphical representation of the electrical characteristics of the switch shown in FIG. 8.
Figure 11:
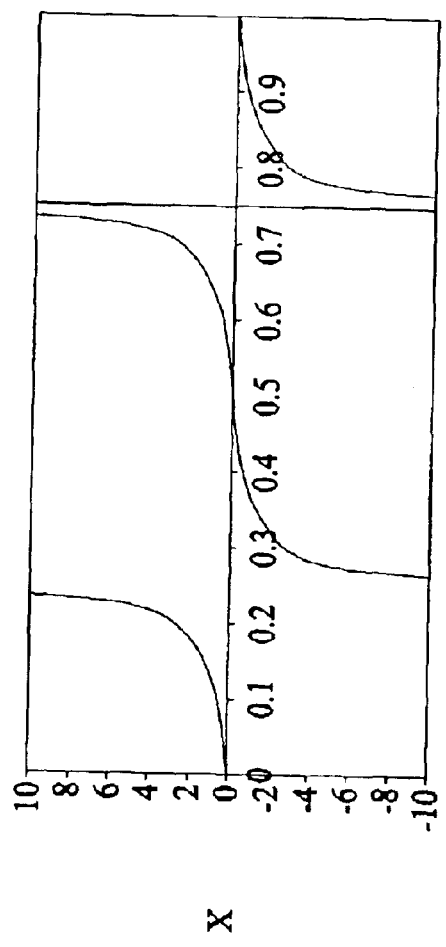
FIG. 11 is a graphical representation of the electrical characteristics of the switch shown in FIG. 10.

FIG. 8 illustrates dynamic disabling switch 120 with an open end. FIG. 9 illustrates the electrical characteristics of switch 120 shown in FIG. 8. FIG. 10 illustrates a dynamic disabling switch 120 with a shorted end. FIG. 11 illustrates the electrical characteristics of switch 120 shown in FIG. 10. During operation, when diode 138 is forward biased, dynamic disabling switch 120 is ideally equivalent to an open circuit at a predetermined frequency of operation, i.e. infinite impedance, as shown in FIG. 11, such that current flows through capacitor 108 thus enabling operation of RF coil 100. To disable RF coil 100, diode 138 is reverse-biased. When diode 138 is reverse biased, capacitor 108 and dynamic disabling switch 120 function as a parallel resonant circuit about the operational frequency of RF coil 100 as shown in FIGS. 9 and 10. The impedance of the parallel resonant circuit is high enough to stop the current flow through capacitor 108, thus disabling RF coil 100. In the exemplary embodiment, a plurality of dynamic disabling switches 120 are electrically coupled to RF coil 108 to disable RF coil 100 when dynamic disabling switches 120 are reverse biased. A switching bias 156 is applied to dynamic disabling circuit 120 through an inductor 158, inductor 160 functions as a lowpass filter. In use, inductors 158 and 160 include an inductance capable of disabling the RF signal path in the operational frequency of RF coil 100 such as, but not limited to, greater than 500 nH at 298 Mhz.

Figure 12:
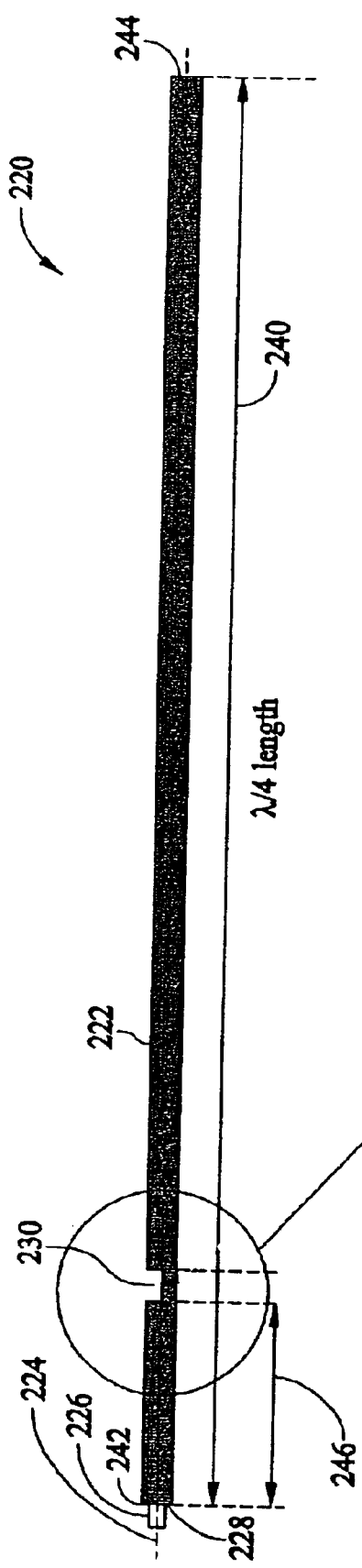
FIG. 12 is a second exemplary dynamic disabling switch that can be used with the RF coil shown in FIG. 2.
Figure 13:
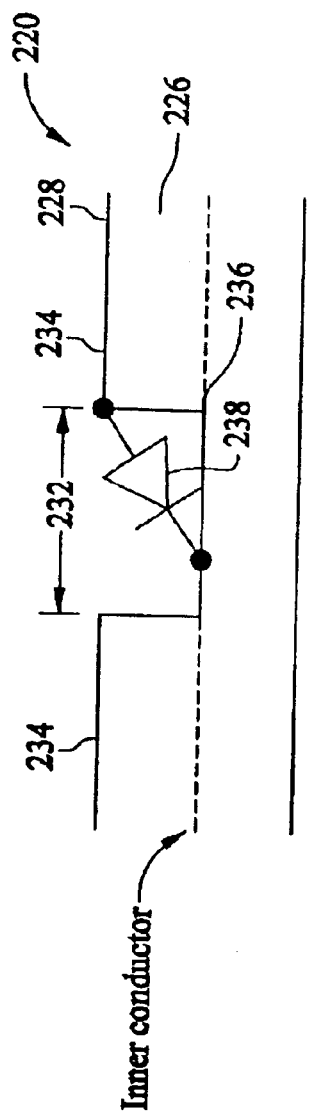
FIG. 13 is portion of the dynamic disabling switch shown in FIG. 12.
Figure 14:
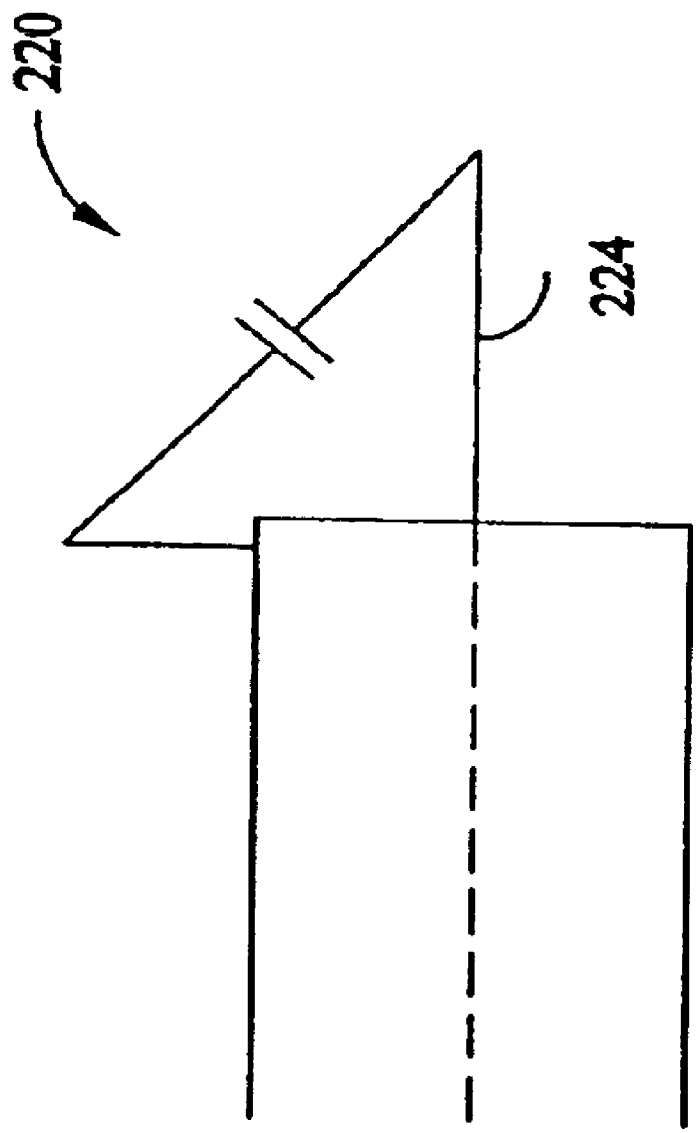
FIG. 14 is portion of the dynamic disabling switch shown in FIG. 12.

FIG. 12 is another exemplary dynamic disabling switch 220 that can be used with RF coil 66 (shown in FIG. 1) or RF coil 100 (shown in FIG. 2). FIG. 13 is a portion of switch 220 shown in FIG. 12. FIG. 14 is another portion of switch 220 shown in FIG. 12. Switch 220 is fabricated using semi-rigid coaxial cable 222 that includes a center conductor 224 fabricated from a metallic material, a middle portion 226 surrounding center conductor 224, and an outer conductor 228, fabricated from a metallic material, surrounding middle portion 226. In the exemplary embodiment, middle portion 226 is an insulator fabricated from a material such as, bot not limited to, Polytetrafluoroethylene (PTFE), i.e. Teflon. In another exemplary embodiment, middle portion 226 is fabricated from any suitable material that includes low loss characteristics such that a signal loss is reduced in RF coil 100.

Switch 220 includes an opening 230, that includes a width 232, and extends from a outer conductor outer surface 234 to an inner conductor outer surface 236. More specifically, a portion of middle portion 226 is removed thus exposing inner conductor 224. A diode 238 is positioned in opening 230 and then electrically coupled to inner conductor 224 and outer conductor 228. Switch 220 includes a first length 240 that extends from a first end 242 of switch 220 to a second end 244 of switch 220 and a second length 246 that extends from first end 242 to first opening end. Diode 238 is electrically coupled such that when diode 238 is forward biased, current flows from outer conductor 228 to inner conductor 224. Alternatively, when diode 238 is reverse biased, current does not flow between inner conductor 224 and outer conductor 228.

Figure 15A:
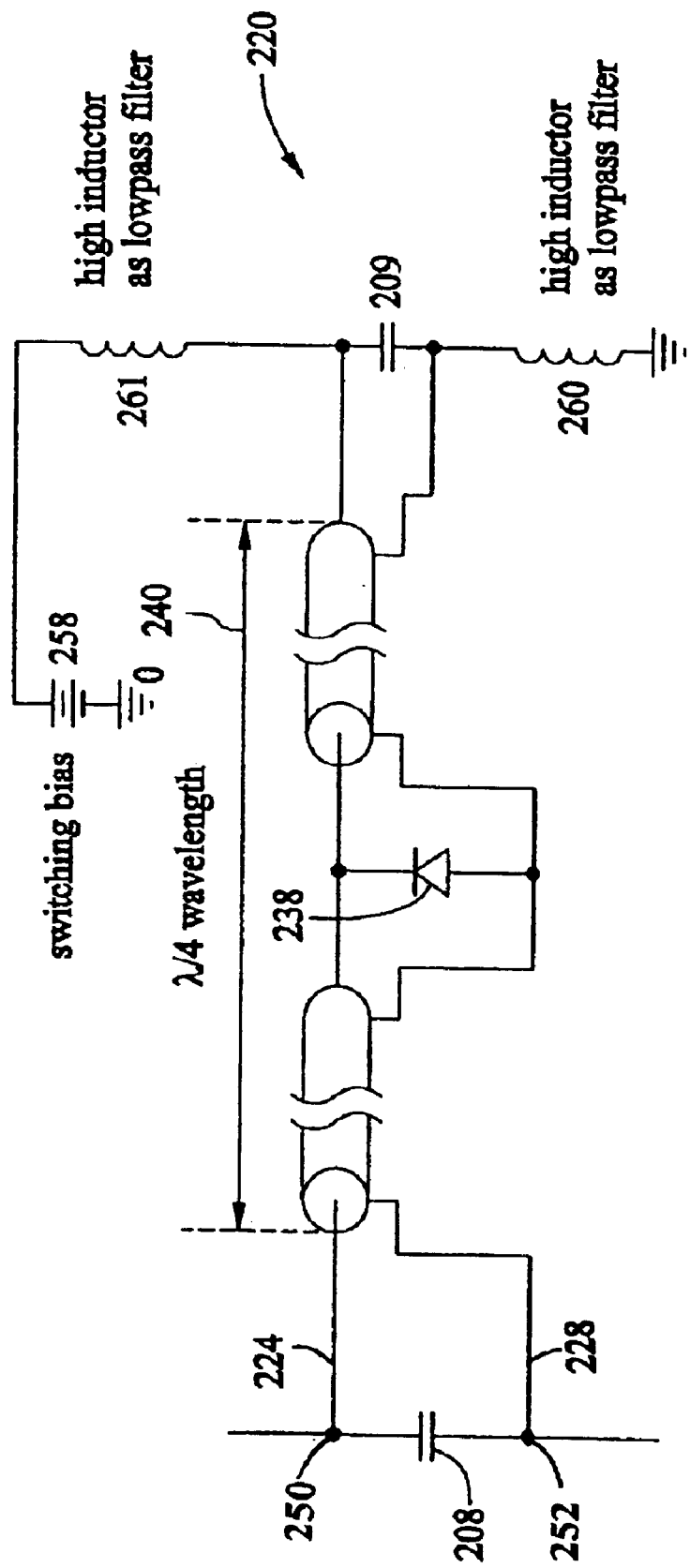
FIG. 15a is an exemplary simplified electrical schematic of the switch shown in FIG. 12.
Figure 15B:
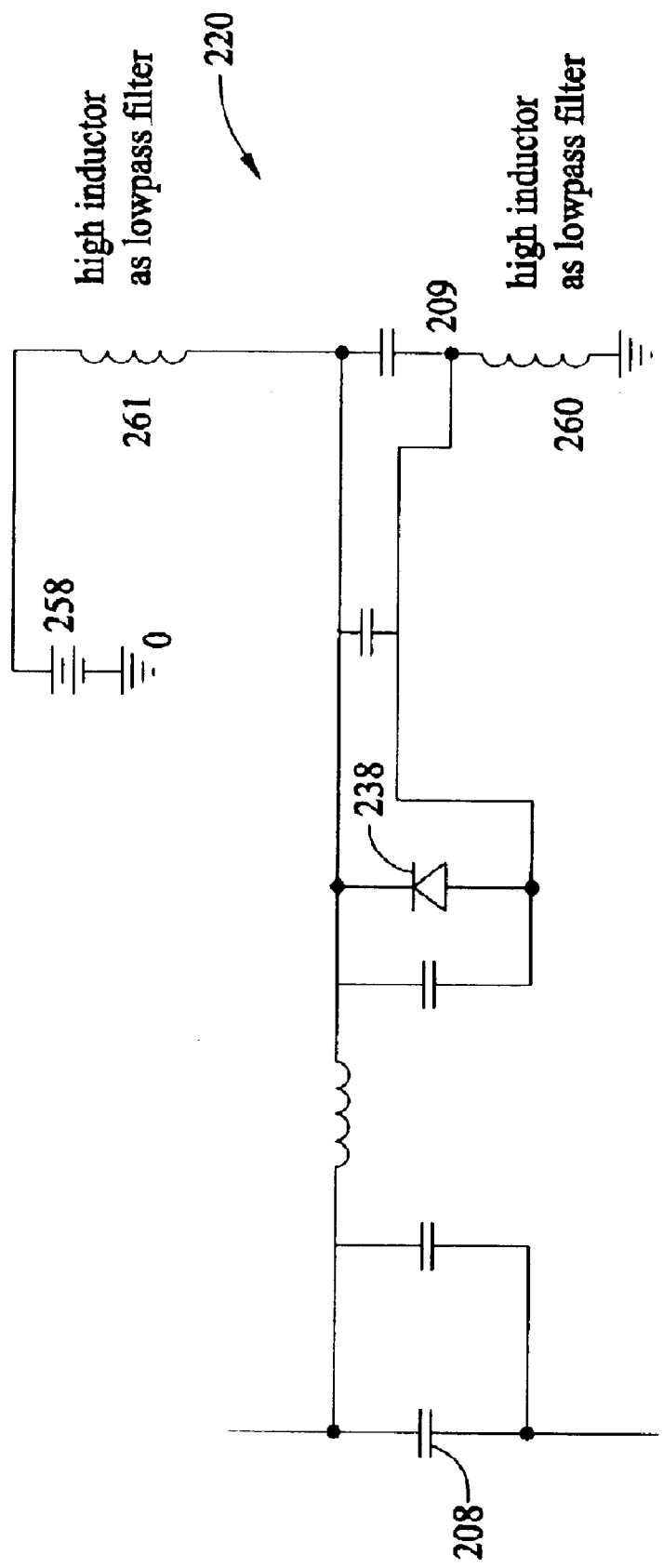
FIG. 15b is an exemplary simplified electrical schematic of the switch shown in FIG. 12.
Figure 17:
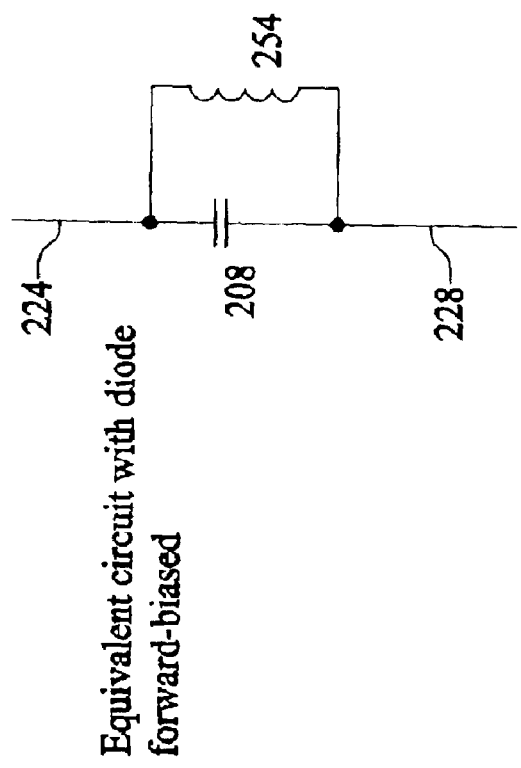
FIG. 17 is an operationally equivalent schematic of the switch shown in FIG. 12.
Figure 16:
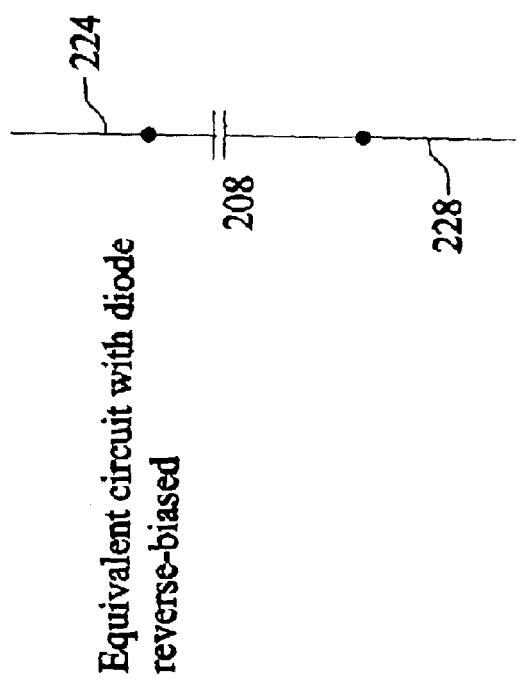
FIG. 16 is an operationally equivalent schematic of the switch shown in FIG. 12.

FIG. 15a is simplified electrically schematic of dynamic disabling switch 220 shown in FIG. 12. FIG. 15b is another simplified electrical schematic of dynamic disabling switch 220 shown in FIG. 12 using lumped circuit elements instead of the coaxial cable. FIG. 16 is schematic illustration of an operationally equivalent circuit depicting diode 238 in a forward biased state. FIG. 17 is schematic illustration of an operationally equivalent circuit depicting diode 238 in a reverse biased state.

In use, at least one end of switch 220 is electrically coupled in parallel with at least one end ring capacitor 208 by connecting inner conductor 224 to a first side 250 of capacitor 208 and connecting outer conductor 228 to a second side 252 of capacitor 208. A portion of outer conductor is removed to form opening 230. Diode 238 is then electrically coupled between inner conductor 224 and outer conductor 228. As shown in FIG. 16, when diode 238 is reverse biased, switch 220 and capacitor 208 are equivalent to capacitor 208. As shown in FIG. 17, when diode 238 is forward biased, switch 220 can be modeled as an inductor 254 in parallel with capacitor 208. Accordingly, the total length 240 from first end 242 to second end 244 is approximately equivalent to a quarter wavelength about the working frequency of RF coil 100. A capacitor 209 is electrically coupled to second end 244 between inner conductor 224 and outer conductor 228 such that an impedance between inner conductor 224 and outer conductor 228 is relatively low, i.e. less than approximately 0.5 ohms for the working frequency of RF coil 100 such that switch 220 approximates a short-ended coaxial cable. In the exemplary embodiment, switch 220 has a capacitance greater than approximately 1000 picoFarad (pF) when RF coil 100 is operating at approximately 100 Mz. Capacitor 209 facilitates cutting a DC path between inner conductor 224 and outer conductor 228 such that a DC switching bias through 260 and inductor 261 works on diode 238. A length 240 and such that inductor 254 forms a parallel resonant circuit with capacitor forward-biased, i.e. an ideal short circuit).

When $\omega_0$ is defined as an operational angular frequency of RF coil 100, then inductor 254 can be defined in accordance with:

$$\omega_0 = 2\pi f = \frac{1}{\sqrt{CL}}$$

where,

C is cpacitor 208, and

L is inductor 254.

For example, if f is set equal to 298 MHz, then length 240 can be selected between approximately onequarter wavelength and approximately one-quarter wavelength of the operational angular frequency of RF coil 100.

During operation, when diode 238 is reverse biased, dynamic disabling switch 220 is ideally equivalent to an open circuit, i.e. infinite impedance, as shown in FIG. 16, such that current flows through capacitor 208 thus enabling operation of RF coil 100. To disable RF coil 100, diode 238 is forward biased. When diode 238 is forward biased, capacitor 208 and dynamic disabling switch 220 function as a parallel resonant circuit about the operational frequency of RF coil 100. The impedance of the parallel resonant circuit is high enough to stop the current flow through capacitor 208, thus disabling RF coil 100. In the exemplary embodiment, a plurality of dynamic disabling switches 220 are electrically coupled to RF coil 100 to disable RF coil 100 when dynamic disabling switches 220 are forward biased. A switching bias 256 is applied to dynamic disabling circuit 220 through an inductor 260 and inductor 261. In use, inductors 260 and 261 include an inductance capable of disabling the RF signal path in the operational frequency of RF coil 100 such as, but not limited to, greater than 500 nH at 298 Mhz.

Figure 18:
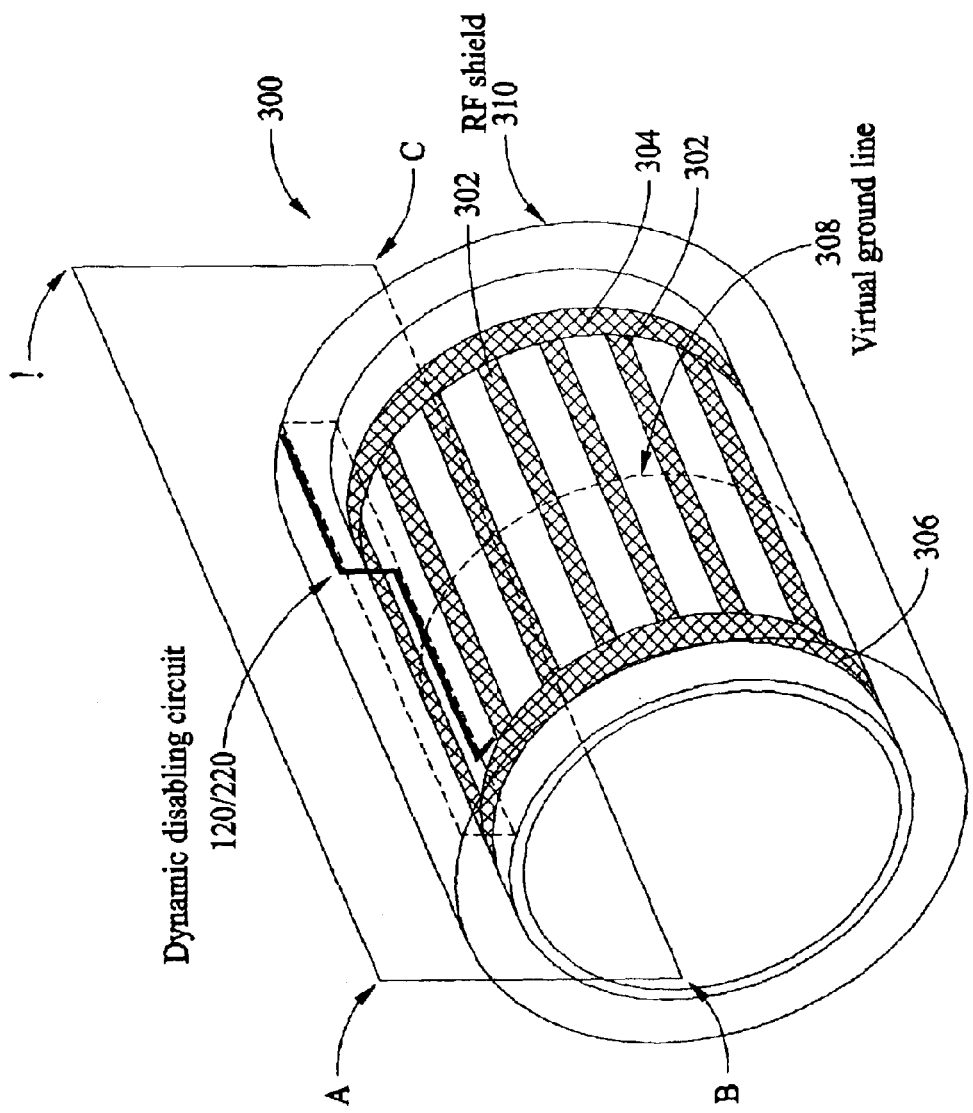
FIG. 18 is an exemplary birdcage coil including at least one dynamic disabling switch as illustrated in FIG. 3 and FIG. 12.
Figure 19:
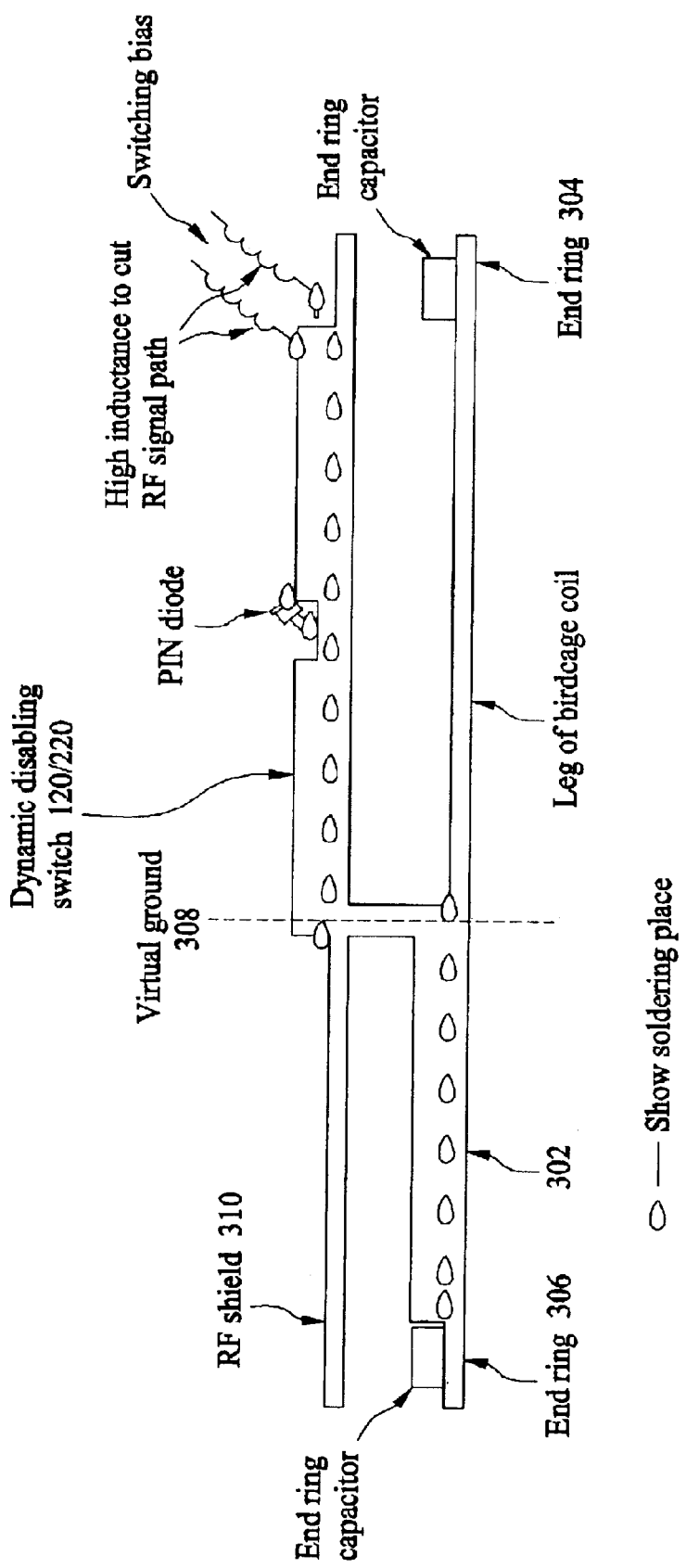
FIG. 19 is cross-sectional view of the birdcage coil including at least one dynamic disabling switch in FIG. 18.

FIG. 18 illustrates at least one of dynamic disabling switch 120 or dynamic disabling switch 220 implemented into birdcage coil 300 that includes approximately sixteen elements 302. FIG. 19 shows the cross section view of planes A, B, C, and D shown in FIG. 18. In the exemplary embodiment, the dynamic disabling switch is electrically coupled in parallel to at least one end ring capacitor of birdcage coil 100 as described previously herein. An outer shield (not shown) of the coaxial cable of dynamic disabling switch 120 or 220 is electrically coupled to element 302 between end ring 304 and end ring 306 at a midpoint 308 located approximately halfway between end ring 304 and end ring 306 where an electric potential is ideally ground point, i.e. a virtual ground. The coaxial cable of dynamic disabling switch 120 or 220 is bent approximately 90 degrees toward an RF shield 310 and is taken out of RF shield 310 through RF shield 310. The coaxial cable of dynamic disabling switch 120 or 220 is bent again by 90 degree toward RF shield 310 and electrically attached to RF shield 310. In the exemplary embodiment, dynamic disabling switch 120 or 220 can be electrically coupled to birdcage 310 without any effect on electric characteristic of birdcage coil 300. The cabling of the switching bias for dynamic disabling switch 120 or 220 can be accomplished without any special care about degradation of the electric characteristic of birdcage coil 300 because the opposite end of the coaxial cable is positioned outside RF shield 310.

In the exemplary embodiment, the dynamic disabling circuit is fabricated using a coaxial cable such that it is difficult for large valued capacitor to be put in dynamic disabling switch 120 or 220 circuit for DC cut high-pass filtering. A quantity of dynamic disabling switches are installed on birdcage 300 based on previous electrical analysis of birdcage coil 300. For example, in the exemplary embodiment, sixteen dynamic disabling switches are used in birdcage coil having thirty-two elements operating at approximately 7T.

Figure 20:
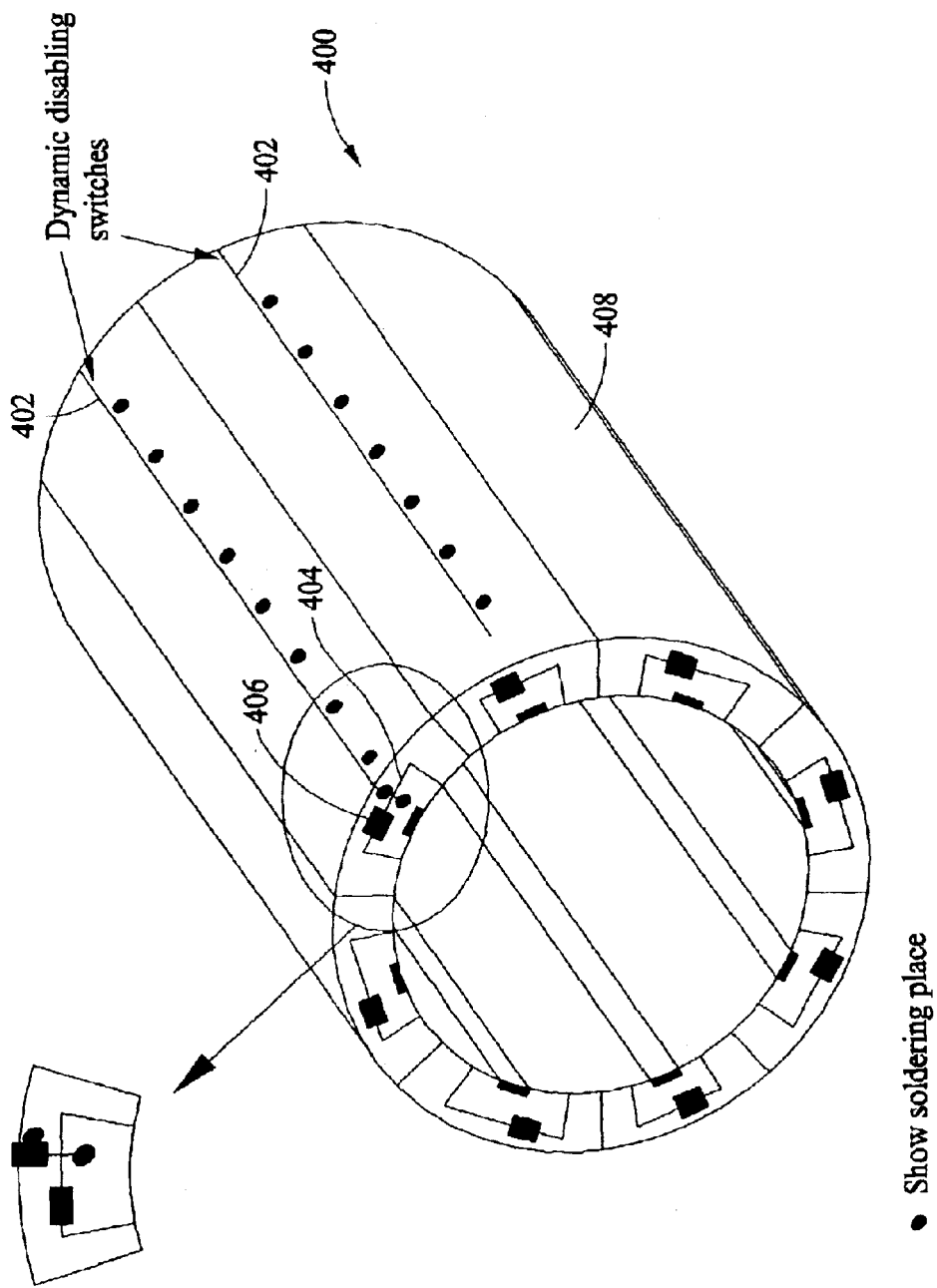
FIG. 20 is an exemplary TEM resonator including at least one dynamic disabling switch as illustrated in FIG. 3 and FIG. 12.

FIG. 20 illustrates a TEM resonator 400 including a plurality of dynamic disabling switches 402, such as switch 120 or switch 220. Each dynamic disabling switch 402 includes a first end 404 electrically coupled around an end ring capacitor 406. Since dynamic disabling switch 402 is already outside of an RF shield 408 after first end 404 is connected, an outer shield of the coaxial cable of dynamic disabling switch 402 can be electrically connected to any position on RF shield 408.

In one embodiment, switch 402 includes a length of approximately 250 mm for switch 120 and approximately 160 mm for switch 220 when used for 7T proton imaging. For 3T proton imaging, a length of switches 120 and 220 are approximately 2.3 times longer than used for 7T proton imaging, i.e. approximately 575 mm for switch 120 and approximately 370 mm for switch 220.

The dynamic disabling switches described herein can be used for high frequency applications and facilitate using a receive only coil including a phased array coil. Therefore, enabling a higher SNR imaging in high frequency system. Dynamic disabling switch circuits and those implementation methods into volume RF coils like birdcage coil or TEM resonator for high field MRI system to switch the volume coil between in enable mode and in disable mode. The invention makes receive only coil available in high field MRI system. The radiation loss by attaching this kind of switch circuit to the RF coil, which is typically more severe in the higher frequency, is reduced by this invention owing to employing semi-rigid coaxial cable (distribution circuit) as the basis of the design. The invention is formed typically by around quarter wavelength of semi-rigid coaxial cable about the desired frequency. The length of this switching circuit becomes practical in high field RF coil like 3T proton body coil or 7T proton head coil etc. The invention is applicable in the higher field by adding additional one or more half wavelength. The invention is also available in lower field by implementation into the RF coil in zigzag way.

While the invention has been described in terms of various specific embodiments, those skilled in the art will recognize that the invention can be practiced with modification within the spirit and scope of the claims.

What is claimed is:

1. A radio frequency (RF) coil assembly for imaging a subject volume using a very high field Magnetic Resonance Imaging (MRI) system operable at substantially high frequencies, said system comprising:
    a plurality of conductors arranged cylindrically and disposed about a patient bore of the MRI system;
    a plurality of capacitive elements disposed between and connecting respective ends of said conductors, said plurality of conductors and plurality of capacitive elements forming a high band pass birdcage configuration; and
    a plurality of dynamic disabling switches, each said dynamic disabling switch comprising a transmission cable providing a predetermined inductive reactance, each said dynamic disabling switch electrically coupled in parallel with a respective capacitive element to form a parallel resonant circuit.

2. A RF coil in accordance with claim 1 wherein said dynamic disabling switches are configured to enable said RF coil when said dynamic disabling switches are forward biased and to disable said RF coil when said dynamic disabling switches are reverse biased.

3. A RF coil in accordance with claim 1 wherein said dynamic disabling switches are configured to enable said RF coil when said dynamic disabling switches are reverse biased and to disable said RF coil when said dynamic disabling switches are forward biased.

4. A RF coil in accordance with claim 1 wherein said capacitive elements comprise low inductance end ring capacitors and said dynamic disabling switches comprise a semi-rigid coaxial cable.

5. A RF coil in accordance with claim 4 wherein said coaxial cable comprises:
    an inner conductor electrically coupled to a first side of said capacitive element;
    a middle insulating portion surrounding a portion of said inner conductor; and
    an outer conductor electrically coupled to a second side of said capacitive element, said outer conductor surrounding a portion of said middle insulating portion.

6. A RF coil in accordance with claim 5 wherein said coaxial cable comprises:
    an opening extending between an outer surface of said outer conductor and said outer surface of said inner conductor; and
    a diode positioned within said opening and electrically coupled to said inner conductor and said outer conductor.

7. A RF coil in accordance with claim 6 further comprising a switching bias electrically coupled to a second end of said dynamic disabling switch, said switching bias configured to forward bias and reverse bias said diode.

8. A RF coil in accordance with claim 1 wherein said dynamic disabling switch includes a length of transmission cable selected such that said length is approximately equivalent to one-quarter wavelength of a working frequency of said RF coil.

9. A RF coil in accordance with claim 1 wherein said very high field MRI system produces a magnetic field greater than approximately 3 Tesla (3T).

10. A RF coil in accordance with claim 1 wherein said substantially high frequencies occur in a range between about 64 MHz to about 500 MHz.

11. A magnetic resonance imaging (MRI) system comprising:
    a radio frequency (RF) coil assembly for imaging a subject volume using substantially high frequencies comprising:
    a plurality of conductors arranged cylindrically and disposed about a patient bore of the MRI system;
    a plurality of capacitive elements disposed between and connecting respective ends of said conductors, said plurality of conductors and plurality of capacitive elements forming a high band pass birdcage configuration; and
    a plurality of dynamic disabling switches, each said dynamic disabling switch comprising a transmission cable providing a predetermined inductive reactance, each said dynamic disabling switch electrically coupled in parallel with a respective capacitive element to form a parallel resonant circuit.

12. An MRI system in accordance with claim 11 wherein said dynamic disabling switches are configured to enable said RF coil when said dynamic disabling switches are forward biased and to disable said RF coil when said dynamic disabling switches are reverse biased.

13. An MRI system in accordance with claim 11 wherein said dynamic disabling switches are configured to enable said RF coil when said dynamic disabling switches are reverse biased and to disable said RF coil when said dynamic disabling switches are forward biased.

14. An MRI system in accordance with claim 11 said capacitive elements comprise low inductance end ring capacitors and said dynamic disabling switches comprise a semi-rigid coaxial cable.

15. An MRI system in accordance with claim 14 wherein said coaxial cable comprises:
    an inner conductor electrically coupled to a first side of said capacitive element;
    a middle insulating portion surrounding a portion of said inner conductor; and
    an outer conductor electrically coupled to a second side of said capacitive element, said outer conductor surrounding a portion of said middle insulating portion.

16. An MRI system in accordance with claim 15 wherein said coaxial cable comprises:
   an opening extending between an outer surface of said outer conductor and said outer surface of said inner conductor; and
   a diode positioned within said opening and electrically coupled to said inner conductor and said outer conductor.

17. An MRI system in accordance with claim 12 further comprising a switching bias electrically coupled to a second end of said dynamic disabling switch, said switching bias configured to forward bias and reverse bias said diode.

18. An MRI system in accordance with claim 11 wherein said dynamic disabling switches include a length of transmission cable selected such that said length is approximately equivalent to one-quarter wavelength of a working frequency of said RF coil.

19. A TEM resonator comprising:
   a plurality of conductors arranged cylindrically and disposed about a patient bore;
   a plurality of capacitive elements disposed between and connecting respective ends of said conductors, said plurality of conductors and plurality of capacitive elements forming a TEM resonator configuration; and
   a plurality of dynamic disabling switches, each said dynamic disabling switch comprising a transmission cable providing a predetermined inductive reactance, each said dynamic disabling switch electrically coupled in parallel with a respective capacitive element to form a parallel resonant circuit.

20. A TEM resonator in accordance with claim 19 wherein said dynamic disabling switches are configured to enable said TEM resonator when said dynamic disabling switches are forward biased and to disable said TEM resonator when said dynamic disabling switches are reverse biased.

21. A TEM resonator in accordance with claim 19 wherein said dynamic disabling switches are configured to enable said TEM resonator when said dynamic disabling switches are reverse biased and to disable said TEM resonator when said dynamic disabling switches are forward biased.

22. A TEM resonator in accordance with claim 19 wherein said capacitive elements comprise low inductance end ring capacitors and said dynamic disabling switches comprise a semi-rigid coaxial cable.

23. A TEM resonator in accordance with claim 22 wherein said coaxial cable comprises:
   an inner conductor electrically coupled to a first side of said capacitive element;
   a middle insulating portion surrounding a portion of said inner conductor;
   an outer conductor electrically coupled to a second side of said capacitive element, said outer conductor surrounding a portion of said middle insulating portion; and
   a diode positioned within said opening and electrically coupled to said inner conductor and said outer conductor.

24. A method for operating a RF coil in a very high field Magnetic Resonance Imaging (MRI) system operable at substantially high frequencies, said method comprising:
   arranging a plurality of conductors cylindrically around a patient bore of the MRI system; connecting a plurality of capacitive elements between respective ends of the conductors, the plurality of conductors and the plurality of capacitive elements forming a high band pass birdcage configuration;
   connecting a plurality of dynamic disabling switches in parallel with a respective capacitive element to form a parallel resonant circuit, each said dynamic disabling switch comprising a transmission cable providing a predetermined inductive reactance, each dynamic disabling switch including a diode; and
   connecting a switching bias to a second end of said dynamic disabling switch, the switching bias configured to forward bias and reverse bias said diode.

25. A method in accordance with claim 24 further comprising forward biasing the dynamic disabling switches to enable the RF coil and reverse biasing the dynamic disabling switches to disable the RF coil.

26. A method in accordance with claim 24 further comprising reverse biasing the dynamic disabling switches to enable the RF coil and forward biasing the dynamic disabling switches to disable the RF coil.

27. A method in accordance with claim 24 wherein said connecting a plurality of dynamic disabling switches in parallel with a respective capacitive element comprises connecting a dynamic disabling switch comprising an inner conductor electrically coupled to a first side of the capacitive element, and outer conductor electrically coupled to a second side of the capacitive element.

28. A method in accordance with claim 27 further comprising electrically coupling a diode between the inner conductor and the outer conductor.

29. A method in accordance with claim 24 further comprising selecting a length of the dynamic disabling switch such that the length is approximately equivalent to one-quarter wavelength of a working frequency of the RF coil.

* * * * *